(12) United States Patent
Hittel (10) Patent No.: US 10,481,216 B1
(45) Date of Patent: Nov. 19, 2019

(54) DEVICE FOR FIELD VERIFICATION OF MULTI-DEVICE POWER OVER ETHERNET

(71) Applicant: Fluke Corporation, Everett, WA (US)

(72) Inventor: John Paul Hittel, Phoenix, AZ (US)

(73) Assignee: FLUKE CORPORATION, Everett, WA (US)

( * ) Notice: Subject to any disclaimer, the term of this patent is extended or adjusted under 35 U.S.C. 154(b) by 0 days.

(21) Appl. No.: 15/966,565

(22) Filed: Apr. 30, 2018

(51) Int. Cl.
    *G01R 31/40* (2014.01)
(52) U.S. Cl.
    CPC .................... *G01R 31/40* (2013.01)
(58) Field of Classification Search
    CPC ........ G01R 31/31712; G01R 31/31716; G01R 31/3177
    See application file for complete search history.

(56) References Cited

U.S. PATENT DOCUMENTS

| | | | | |
|---|---|---|---|---|
| 2007/0170909 A1* | 7/2007 | Vorenkamp | ............ | G06F 1/266 324/76.11 |
| 2008/0151457 A1* | 6/2008 | Apfel | ..................... | H04L 12/10 361/111 |
| 2008/0219173 A1* | 9/2008 | Yoshida | .................. | H04L 43/50 370/241.1 |

FOREIGN PATENT DOCUMENTS

| WO | 2017/001179 A1 | 1/2017 |
|---|---|---|
| WO | 2017/198498 A1 | 11/2017 |

OTHER PUBLICATIONS

Extended European Search Report, dated Jul. 16, 2019, for European Application No. 19171685.1, 7 pages.

\* cited by examiner

*Primary Examiner* — Jermele M Hollington
*Assistant Examiner* — Alvaro E Fortich
(74) *Attorney, Agent, or Firm* — Seed Intellectual Property Law Group LLP (57) ABSTRACT

A power testing device includes a communication port with pins that receive signals from a device under test. First test circuitry is coupled to a first set of pairs of the pins, and second test circuitry is coupled to a second set of pairs of the pins. A switch is coupled to the first test circuitry and/or the second test circuitry. While the switch is in a first state, the first test circuitry and the second test circuitry are electrically isolated from each other. While the switch is in a second state, the first test circuitry and the second test circuitry are not electrically isolated from each other. A processor is coupled to the first test circuitry, the second test circuitry, and the switch. A memory stores instructions that cause the processor to control operation of the first test circuitry, the second test circuitry, and the switch.

20 Claims, 6 Drawing Sheets

DEVICE FOR FIELD VERIFICATION OF MULTI-DEVICE POWER OVER ETHERNET

BACKGROUND

Technical Field

The present disclosure relates to electronic testing devices, and more particularly to electronic testing devices that determine characteristics of power supplied by equipment that can provide power for multiple devices over a single cable.

Description of the Related Art

Power over Ethernet (PoE) technology enables devices to receive both network communications and power over a single Ethernet cable from a PoE enabled switch. Alternatively, instead of using a PoE enabled switch, a power injector after a non-PoE enabled switch network switch may be used to supply power for an end device, and a power splitter at the end device may be used to provide separate network and power connections to a device that does not have built-in PoE capability.

According to PoE terminology, a device that supplies power is called Power Sourcing Equipment (PSE), and a device that uses power is called a Powered Device (PD). The basic idea of PoE technology is that an operator can plug one end of an Ethernet cable into a PSE (e.g., network switch) and plug the other end of the Ethernet cable into a PD (e.g., a security camera or wireless access point) and the PSE provides power to operate the PD and also provides data to the PD via the Ethernet cable. Various proprietary PoE methods have been used. In addition, PoE methods have been and continue to be standardized by the Institute of Electrical and Electronics Engineers (IEEE). Examples of IEEE standards that have been and are being developed include IEEE 802.3af, IEEE 802.3at, and IEEE 802.3bt.

A PD requires a specific amount of power to operate; however, a PSE may not be capable of sourcing that amount power. Factors that affect the amount of power a PSE can source include the basic design of the PSE, the amount of power the PSE is supplying to other PDs, and the amount of power that is dissipated in cabling. Because of differing power sourcing abilities at the PSE and different power requirements at each PD, it is possible for an end user to connect a PD (e.g., a camera) to a PSE (e.g., a network switch), and have the PD fail to operate due to a lack of sufficient power. Conventional PoE test devices can show an operator how much power a PSE can supply, which enables the operator to look at the specifications for a PD and determine whether or not the PD should be able to draw enough power to operate.

BRIEF SUMMARY

New PoE systems in development may provide single signature and dual signature compatibility. New PoE standards for such systems recognize that power may be provided to two devices at one end of an Ethernet cable. A common example occurs with outdoor security cameras. One vendor may provide an outdoor security camera, and another vendor may provide a heated outdoor enclosure in which the camera is installed. The easiest solution is for the camera and the enclosure to negotiate independently for their power requirements. Newly proposed PoE standards acknowledge this with the concept of single signature PDs and dual signature PDs. A single signature PD requires power with certain characteristics to be provided for a single device connected to an Ethernet cable. A dual signature PD requires power to be provided to a first device and a second device that are both connected to an end of an Ethernet cable, wherein characteristics of the power required by the first device may be different from characteristics of the power required by the second device. One such newly proposed PoE standard is IEEE 802.3bt, which will provide the ability for a PSE and a PD to negotiate the characteristics or signature of the power provided from the PSE to the PD over an Ethernet cable. A single signature PD negotiates as a single device for all the power needed at its end of an Ethernet cable. A dual signature PD may be thought of as having two "devices" that negotiate independently on different twisted pair sets. For example, a dual signature PD may negotiate independently on twisted pair sets 12-36 for a first device and on twisted pair sets 45-78 for a second device.

Accordingly, the present disclosure describes embodiments of a PoE testing device (e.g., power testing device 104 shown in FIG. 1) that determines whether a PSE (e.g., power sourcing device 102 shown in FIG. 1) can support dual signature power provision. In addition, embodiments described herein provide a PoE testing device that determines characteristics of power that can be provided by a PSE that supports dual signature power provision.

Thus, in at least one embodiment, the present disclosure teaches a PoE testing device (e.g., power testing device 104 shown in FIG. 1) that connects to a PSE (e.g., power sourcing device 102 shown in FIG. 1) and determines whether the PSE is able to provide single signature power negotiation, dual signature power negotiation, or both. In addition, the present disclosure teaches a PoE testing device that connects to a PSE and determines the amount of power available from the PSE when it operates in a single signature power mode and when it operates in a dual signature power mode.

A power testing device that tests power providing capabilities of a device under test may be summarized as including a communication port including a plurality of pins, the communication port, in operation, receiving signals from the device under test via a cable that includes a plurality of wires electrically coupled to the pins of the communication port; first test circuitry electrically coupled to a first set of pairs of the pins of the communication port; second test circuitry electrically coupled to a second set of pairs of the pins of the communication port; a switch electrically coupled to at least one of the first test circuitry and the second test circuitry, wherein, while the switch is in a first state, the first test circuitry and the second test circuitry are electrically isolated from each other, and wherein, while the switch is in a second state, the first test circuitry and the second test circuitry are not electrically isolated from each other; a processor coupled to the first test circuitry, the second test circuitry, and the switch; and a memory coupled to the processor, the memory storing processor-readable instructions that, when executed by the processor, cause the processor to: control operation of the first test circuitry; control operation of the second test circuitry; and control the switch to be in one of the first state or the second state.

The processor-readable instructions, when executed by the processor, may cause the processor to independently control the first test circuitry and the second test circuitry. The processor-readable instructions, when executed by the processor, may further cause the processor to determine whether probing from the device under test is detected by both the first test circuitry and the second test circuitry while controlling the switch to be in the first state. The power testing device may further include a display device, and processor-readable instructions, when executed by the processor, may cause the processor to: in response to determining that probing from the device under test is detected by both the first test circuitry and the second test circuitry: control the first test circuitry to perform testing of the device under test using the first set of pairs of the pins of the communication port; and control the second test circuitry to perform testing of the device under test using the second set of pairs of the pins of the communication port; and after the first test circuitry performs the testing using the first set of pairs of the pins of the communication port and the second test circuitry performs the testing using the second set of pairs of the pins of the communication port: control the display to display a message indicating that the device under test is a dual signature capable device; and control the switch to be in the second state. The processor may control the first test circuitry to perform the testing using the first set of pairs of the pins of the communication port and may control the second test circuitry to perform the testing using the second set of pairs of the pins while the processor controls the switch to be in the second state.

The processor-readable instructions, when executed by the processor, may further cause the processor to in response to determining that probing is detected by the first test circuitry and is not detected by the second test circuitry: control the first test circuitry to perform testing of the device under test using the first set of pairs of the pins of the communication port while controlling the switch to be in the second state; and control the display device to display a message indicating that the device under test is a single signature capable device.

The processor-readable instructions, when executed by the processor, may further cause the processor to, in response to determining that probing is not detected by the first test circuitry and is detected by the second test circuitry: control the second test circuitry to perform testing of the device under test using the second set of pairs of the pins of the communication port; and control the display device to display a message indicating that the device under test is a single signature capable device; and in response to determining that probing is not detected by the first test circuitry and the second test circuitry, control the display device to display a message indicating that the device under test is neither a dual nor single signature capable device. The power testing device may further include data isolation circuitry electrically coupled to the processor and the second test circuitry, the data isolation circuitry, in operation, providing to the second test circuitry a data signal that is electrically isolated from the first test circuitry; and power isolation circuitry including an input terminal electrically coupled to a terminal which provides a power signal that is not electrically isolated from the first test circuitry, and an output terminal electrically coupled to a power terminal of the second test circuitry, the power isolation circuitry, in operation, providing to the power input terminal of the second test circuitry a power signal that is electrically isolated from the first test circuitry, wherein the switch may include a first terminal electrically coupled to the terminal which provides the power signal that is not electrically isolated from the first test circuitry, and a second terminal electrically coupled to the power input terminal of the second test circuitry, wherein, while the switch is in the first state, the switch does not electrically couple the input terminal of the power isolation circuitry and the output terminal of the power isolation circuitry and does not provide to the power input terminal of the second test circuitry the power signal that is not electrically isolated from the first test circuitry, and wherein, while the switch is in the second state, the switch electrically couples the input terminal of the power isolation circuitry and the output terminal of the power isolation circuitry and provides to the power input terminal of the second test circuitry the power signal that is not electrically isolated from the first test circuitry.

A method of operating a power testing device that tests power providing capabilities of a device under test may be summarized as including electrically isolating first test circuitry from second test circuitry; determining whether probing by the device under test is detected by both the first test circuitry and the second test circuitry; in response to determining that the probing is detected by both the first test circuitry and the second test circuitry: performing testing of the device under test using a first set of pairs of a plurality of pins of a communication port and the first test circuitry; performing testing of the device under test using a second set of pairs of the pins of the communication port and the second test circuitry; and displaying a message indicating that the device under test is a dual signature capable device; and after performing the testing of the device under test using the first set of pairs of the pins of the communication port and the first test circuitry and performing the testing of the device under test using the second set of pairs of the pins of the communication port and the second test circuitry, de-isolating the first test circuitry from the second test circuitry. Performing the testing of the device under test using the first set of pairs of the pins of the communication port and the first test circuitry and performing the testing of the device under test using the second set of pairs of the pins of the communication port and the second test circuitry may be performed concurrently. The performing of the testing using the first set of pairs of the pins of the communication port and the first test circuitry, the performing of the testing using the second set of pairs of the pins of the communication port and the second test circuitry are performed concurrently, and the isolating of the first test circuitry from the second test circuitry may be performed concurrently. De-isolating the first test circuitry from the second test circuitry may be performed after determining that the device under test is the dual signature capable device.

The method may further include determining that probing is detected by the first test circuitry; determining that probing is not detected by the second test circuitry; in response to determining that probing is detected by the first test circuitry and that probing is not detected by the second test circuitry: performing testing of the device under test using the first set of pairs of the pins of the communication port and the first test circuitry; and displaying a message indicating that the device under test is a single signature capable device.

The method may further include displaying a message indicating that the device under test provides power by pins 1, 2, 3, and 6 of the communication port.

The method may further include displaying a message indicating a characteristic of power provided by the device under test via the first set of pairs of the pins of the communication port.

The method may further include determining that probing is not detected by the first test circuitry; determining that probing is detected by the second test circuitry; in response to determining that probing is not detected by the first test circuitry and that probing is detected by the second test circuitry: performing testing of the device under test using the second set of pairs of the pins of the communication port and the second test circuitry; and displaying a message indicating that the device under test is a single signature capable device.

The method may further include displaying of a message indicating that the device under test provides power by pins 4, 5, 7, and 8 of the communication port.

The method may further include displaying of a message indicating a characteristic of power provided by the device under test via the second set of pairs of the pins of the communication port.

The method may further include determining that probing is not detected by the first test circuitry during the de-isolating of the first test circuitry from the second test circuitry; determining that probing is not detected by the second test circuitry during the de-isolating of the first test circuitry from the second test circuitry; and in response to the determining that probing is not detected by the first test circuitry and that probing is not detected by the second test circuitry, displaying a message indicating that the device under test is neither a dual nor single signature capable device.

DETAILED DESCRIPTION

Figure 1:
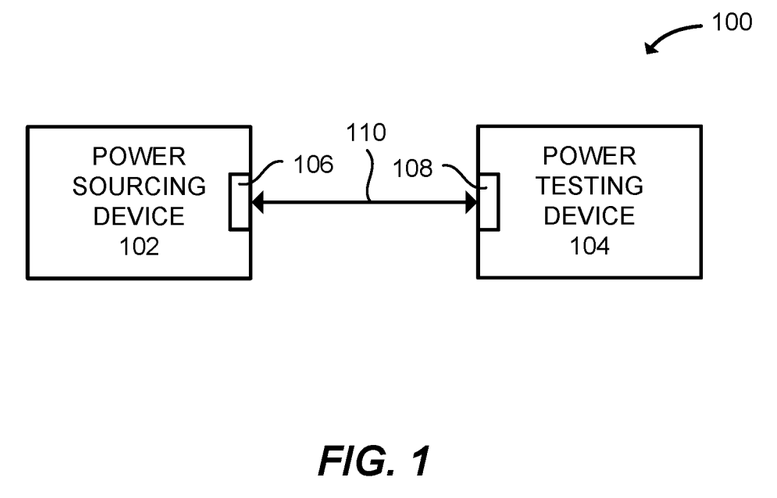
FIG. 1 is a diagram of a Power over Ethernet (PoE) testing system, according to one or more embodiments of the present disclosure.
Figure 2:
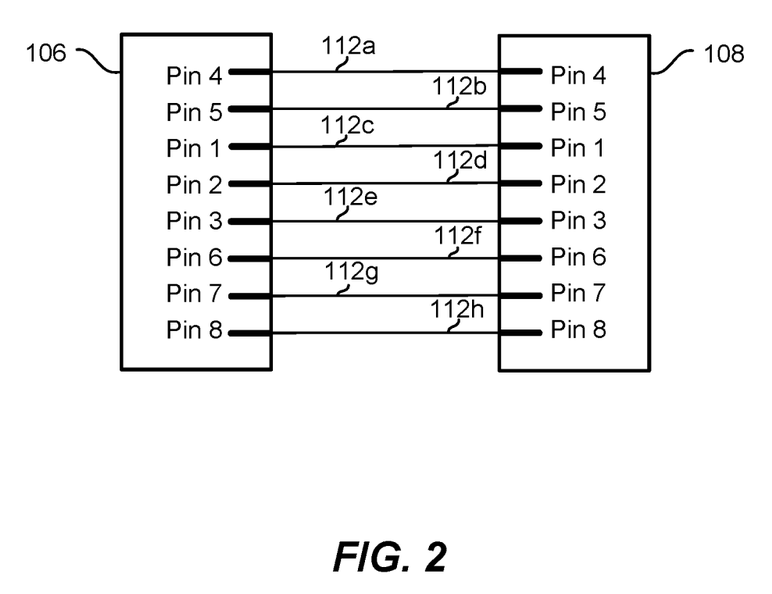
FIG. 2 is a diagram illustrating connections between a power sourcing device and a power testing device, according to one or more embodiments of the present disclosure.

FIG. 1 is a diagram of a Power over Ethernet (PoE) test system 100, according to one or more embodiments of the present disclosure. The PoE test system 100 includes a device under test or power sourcing device 102 and a power testing device 104. The power sourcing device 102 includes a communication port 106 (e.g., Ethernet jack or socket), and the power testing device 104 includes a communication port 108 (e.g., Ethernet jack or socket). The power sourcing device 102 and the power testing device 104 are communicatively coupled to one another via an Ethernet cable 110. More particularly, a first end of the Ethernet cable 110 includes a first RJ45 connector (not shown) that is plugged into the communication port 106 of the power sourcing device 102, and a second end of the Ethernet cable 110 includes a second RJ45 connector (not shown) that is plugged into the communication port 108 of the power testing device 104. The Ethernet cable 110 may be a Cat3, Cat5, Cat5e, or Cat6 cable, for example. FIG. 2 is a diagram illustrating electrical connections between a power sourcing device 102 and a power testing device 104, according to one or more embodiments of the present disclosure. The communication port 106 of the power sourcing device 102 and the communication port 108 of the power testing device 104 each have eight pins (i.e., terminals, conductors). The Ethernet cable 110 includes eight wires 112a to 112h that electrically couple the pins of the communication port 106 of the power sourcing device 102 to the pins of the communication port 108 of the power testing device 104, when the first RJ45 connector (not shown) at one end of the Ethernet cable 110 is plugged into the communication port 106 and the second RJ45 connector (not shown) at the other end of the Ethernet cable 110 is plugged into the Ethernet port 108.

The wires 112a to 112h of the Ethernet cable 110 are arranged in sets of twisted pairs of wires. More particularly, wires 112a and 112b form one twisted pair set, wires 112c and 112d form one twisted pair set, wires 112e and 112f form one twisted pair set, and wires 112g and 112h form one twisted pair set. As shown in FIG. 2, wire 112a electrically couples pin 4 of the communication port 106 with pin 4 of the communication port 106, and wire 112b electrically couples pin 5 of the communication port 106 with pin 5 of the communication port 108. Wire 112c electrically couples pin 1 of the communication port 106 with pin 1 of the communication port 108, and wire 112d electrically couples pin 2 of the communication port 106 with pin 2 of the communication port 108. Wire 112e electrically couples pin 3 of the communication port 106 with pin 3 of the communication port 108, and wire 112f electrically couples pin 6 of the communication port 106 with pin 6 of the communication port 108. Wire 112g electrically couples pin 7 of the communication port 106 with pin 7 of the communication port 108, and wire 112h electrically couples pin 8 of the communication port 106 with pin 8 of the communication port 108.

The power sourcing device 102 provides power and data independently to the power testing device 104. The power sourcing device 102 provides data "inside" a pair set or pair sets. For example, the power sourcing device 102 can provide data on the 12-36 pair set, or on all four pair sets. The power sourcing device 102 provides power using pair sets in parallel. For example, the power sourcing device 102 can provide power using pins 4 and 5 in parallel as one half of a circuit, and using pins 7 and 8 in parallel as the other half of the circuit. Accordingly, when the power sourcing device 102 provides power on pins 4 and 5 and on pins 7 and 8 of the communication port 106, the power is received on pins 4 and 5 and on pins 7 and 8 of the communication port 108 of the power testing device 104. When the power sourcing device 102 provides on pins 1 and 2 and on pins 3 and 6 of the communication port 106, the power is received on pins 1 and 2 and on pins 3 and 6 of the communication port 108 of the power testing device 104.

Figure 3:
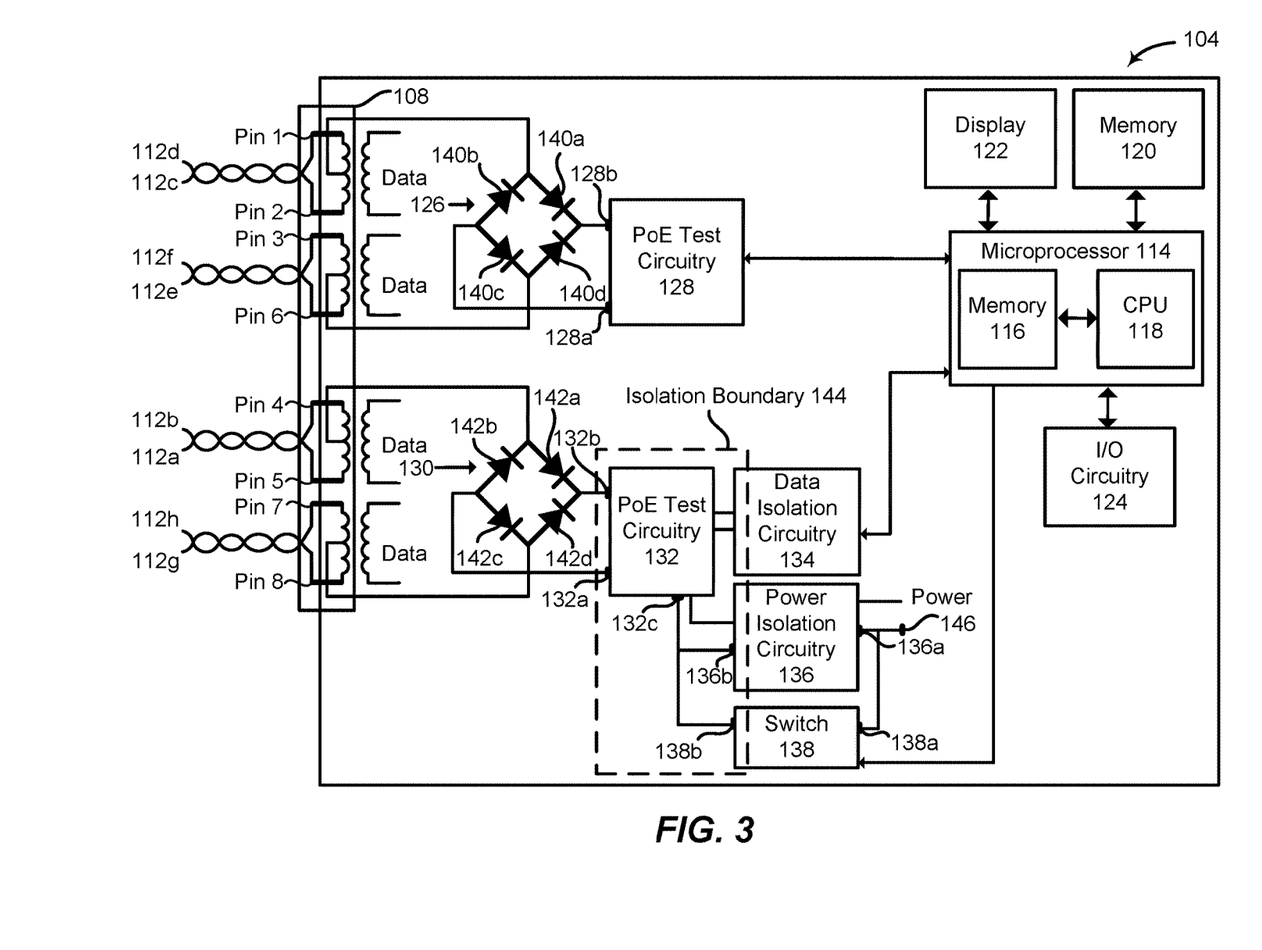
FIG. 3 is a diagram illustrating components of a power testing device, according to one or more embodiments of the present disclosure.

FIG. 3 is a diagram illustrating components of a power testing device 104, according to one or more embodiments of the present disclosure. The power testing device 104 includes the communication port 108, a microprocessor 114 having a memory 116 and a central processing unit (CPU) 118, a memory 120, a display device 122, input/output (I/O) circuitry 124, a first diode bridge 126, first PoE test circuitry 128, a second diode bridge 130, second PoE test circuitry 132, data isolation circuitry 134, power isolation circuitry 136, and a switch 138.

A first transformer (not labeled) is coupled to pins 1 and 2 of the communication port 108, which electrically isolates data signals received via pins 1 and 2 of the communication port 108 from corresponding power signals that are provided to the first PoE test circuitry 128. A second transformer (not labeled) is coupled to pins 3 and 6 of the communication port 108, which electrically isolates data signals received via pins 3 and 6 of the communication port 108 from corresponding power signals that are provided to the first PoE test circuitry 128. A third transformer (not labeled) is coupled to pins 4 and 5 of the communication port 108, which electrically isolates data signals received via pins 4 and 5 of the communication port 108 from corresponding power signals that are provided to the second PoE test circuitry 132. A fourth transformer (not labeled) is coupled to pins 7 and 8 of the communication port 108, which electrically isolates data signals received via pins 7 and 8 of the communication port 108 from corresponding power signals that are provided to the second PoE test circuitry 132.

The first diode bridge 126 includes a first diode 140a, a second diode 140b, a third diode 140c, and a fourth diode 140d. More particularly, the anode of the first diode 140a is electrically coupled to the cathode of the second diode 140b and to pins 1 and 2 of the communication port 108, the anode of the second diode 140b is electrically coupled to the anode of the third diode 140c and to a first terminal 128a of the first PoE test circuitry 128, the cathode of the third diode 140c is electrically coupled to the anode of the fourth diode 140d and to pins 3 and 6 of the communication port 108, and the cathode of the fourth diode 140d is electrically coupled to the cathode of the first diode 140a and to a second terminal 128b of the first PoE test circuitry 128.

As set forth above, the first PoE test circuitry 128 is electrically coupled to pins 1, 2, 3, and 6 of the communication port 108 via the first diode bridge 126. The first PoE test circuitry 128 also is electrically coupled to the microprocessor 114, which provides control signals to the first PoE test circuitry 128 that cause the first PoE test circuitry 128 to perform various aspects of a power negotiation process. The first PoE test circuitry 128 provides corresponding test result data to the microprocessor 114. In one or more embodiments, the first PoE test circuitry 128 is a Model PD70200 PD Front End Integrated Circuit available from the Microsemi Corporation.

The second diode bridge 130 includes a first diode 142a, a second diode 142b, a third diode 142c, and a fourth diode 142d. More particularly, the anode of the first diode 142a is electrically coupled to the cathode of the second diode 142b and to pins 4 and 5 of the communication port 108, the anode of the second diode 142b is electrically coupled to the anode of the third diode 142c and to a first terminal 132a of the second PoE test circuitry 132, the cathode of the third diode 142c is electrically coupled to the anode of the fourth diode 142d and to pins 7 and 8 of the communication port 108, and the cathode of the fourth diode 142d is electrically coupled to the cathode of the first diode 142a and to a second terminal 132b of the second PoE test circuitry 132.

As set forth above, the second PoE test circuitry 132 is electrically coupled to pins 4, 5, 7, and 8 of the communication port 108 via the second diode bridge 130. The second PoE test circuitry 132 also is electrically coupled to a terminal of the microprocessor 114, which provides control signals to the second PoE test circuitry 132 that cause the second PoE test circuitry 132 to perform various predetermined power negotiation and test procedures. The second PoE test circuitry 132 provides corresponding test result data to the microprocessor 114. In one or more embodiments, the second PoE test circuitry 132 is a Model PD70200 PD Front End Integrated Circuit available from the Microsemi Corporation.

The data isolation circuitry 134 is electrically coupled between the second PoE test circuitry 132 and the microprocessor 114. The data isolation circuitry 134 electrically isolates the second PoE test circuitry 132 from other components of the power testing device 104. Notably, the data isolation circuitry 134 electrically isolates the second PoE test circuitry 132 from the first PoE test circuitry 128. In one or more embodiments, the data isolation circuitry 134 employs an optical isolator that transfers electrical signals between the data isolation circuitry 134 and the second PoE test circuitry 132 using light. In one or more embodiments, the data isolation circuitry 134 is a Model ADUM1265 Digital Isolator Integrated Circuit available from Analog Devices, Inc.

A power input terminal 136a of the power isolation circuitry 136 receives a power signal from a terminal 146, which is electrically coupled to a power supply (not shown) of the power testing device 104, which may be a battery, for example. The power isolation circuitry 136 suppresses electrical surges, performs noise filtering, and generates an isolated power signal that is not influenced by other components of the power testing device 104, including the first PoE test circuitry 128. A power output terminal 136b of the power isolation circuitry 136 provides the isolated power signal to a power input terminal 132c of the second PoE test circuitry 132. In one or more embodiments, the power isolation circuitry 136 is a Model MAX17682 DC-DC Converter Integrated Circuit available from Maxim Integrated Products, Inc.

A first terminal 138a of the switch 138 is electrically coupled to the power input terminal 136a of the power isolation circuitry 136 and to the terminal 146 that is electrically coupled to the power supply (not shown) of the power testing device 104. A second terminal 138b of the switch 138 is electrically coupled to the power output terminal 136b of the power isolation circuitry 136 and to the power input terminal 132c of the second PoE test circuitry 132. The switch 138 is electrically coupled to the microprocessor 114, which provides control signals to the switch 138 in order to control a state of the switch 138. While the microprocessor 114 provides a control signal having a first characteristic (e.g., a first voltage level), the switch 138 is in an open state. While the microprocessor 114 provides a control signal having a second characteristic (e.g., a second voltage level), the switch 138 is in a closed state.

While the switch 138 is in the open state, the power isolation circuitry 136 electrically isolates the power supplied to the second PoE test circuitry 132 from other components of the power testing device 104, including the first PoE test circuitry 128. In addition, the switch 138 does not provide the power signal from the terminal 146 to the second PoE test circuitry 132. In addition, while the switch 138 is in the open state, a ground terminal of the data isolation circuitry 134 is electrically coupled to a ground potential (e.g., provided by the power isolation circuitry 136) that is isolated from other components, which causes the data isolation circuitry 134 to provide to the second PoE test circuitry 132 a data signal that is isolated from other components, including the first PoE test circuitry 128. A dashed line in FIG. 3 indicates an isolation boundary 144.

While the switch 138 is in the closed state, the power input terminal 136a and the power output terminal 136b of the power isolation circuitry 136 are electrically coupled together (i.e., electrically shorted), and the second terminal 138b of the switch 138 provides the power signal from the terminal 146 to the power input terminal 132c of the second PoE test circuitry 132. Accordingly, while the switch 138 is in the closed state, the power isolation circuitry 136 is effectively bypassed and, therefore, it does not electrically isolate the power provided to the second PoE test circuitry 132 from other components of the power testing device 104, including the first PoE test circuitry 128. In addition, while the switch 138 is in the closed state, the ground terminal of the data isolation circuitry 134 is electrically coupled to a ground potential that is not isolated from other components, which causes the data isolation circuitry 134 to provide to the second PoE test circuitry 132 a data signal that is not isolated from other components, including the first PoE test circuitry 128.

In one more embodiments, the switch 138 is a mechanical relay. In one or more embodiments, the switch 138 is an optocoupler.

The memory 120 stores processor-executable instructions that, when executed by the CPU 118, cause the power testing device 104 to perform the functions described in connection with FIGS. 4A, 4B, and 4C. The CPU 118 uses the memory 116 as a working memory while executing the instructions. In one or more embodiments, the memory 116 is comprised of one or more random access memory (RAM) modules. In one or more embodiments, the memory 120 is comprised of one or more non-volatile random access memory (NVRAM) modules, such as electronically erasable programmable read-only memory (EEPROM) or Flash memory modules, for example.

The display device 122 graphically displays information to an operator. The microprocessor 114 controls the display device 122 to display information related to testing performed by the power testing device 104. In one or more embodiments, the display device 122 is a liquid crystal display (LCD) device. In one or more embodiments, the display device 122 includes a touchscreen.

In one or more embodiments, the I/O circuitry 124 may include buttons, switches, dials, knobs, or other user-interface elements for inputting commands to the power testing device 104. The I/O circuitry 124 also may include a speaker, one or more light emitting devices, or other user-interface elements for outputting information or indications from the power testing device 104.

Figure 4A:
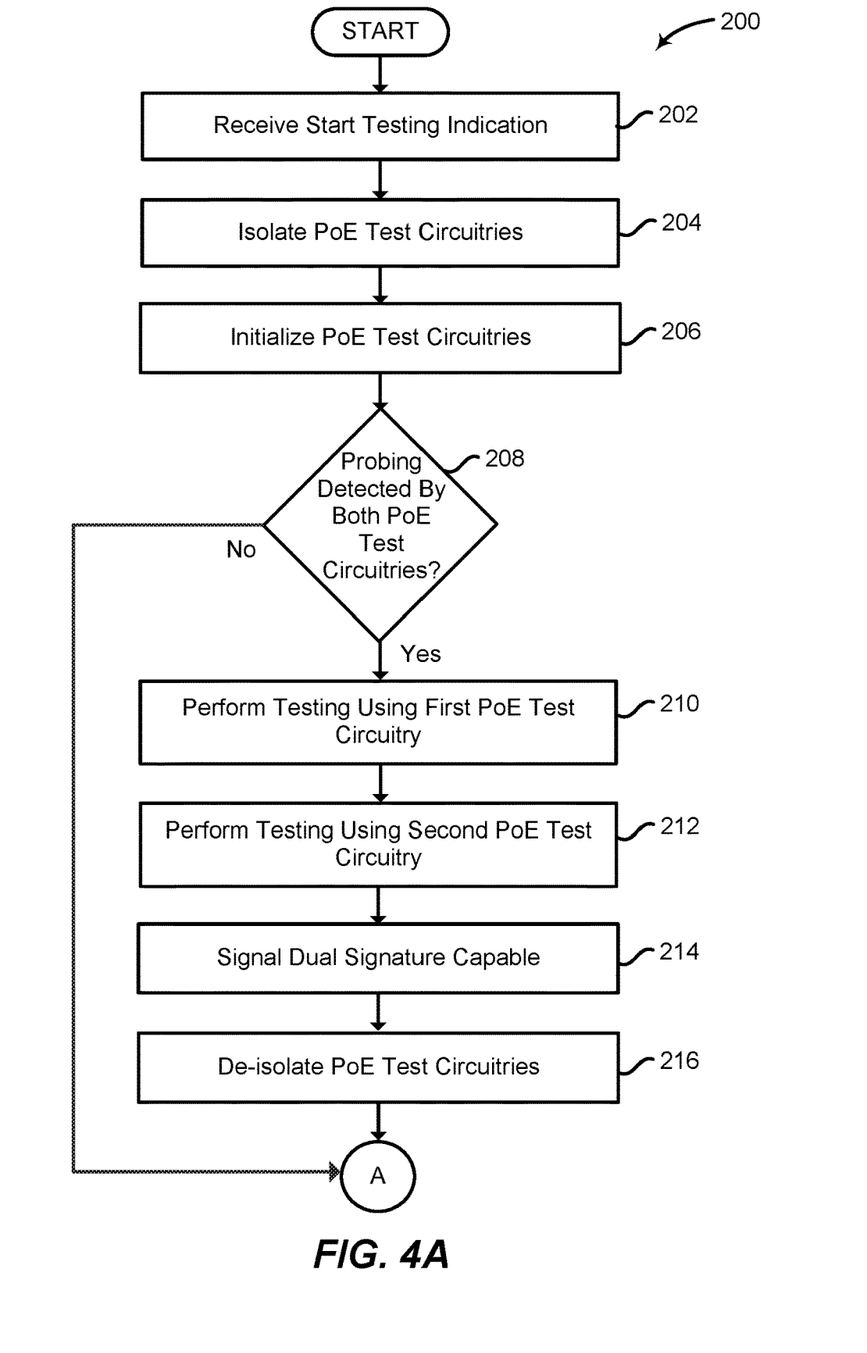
FIGS. 4A, 4B, and 4C are diagrams illustrating a flowchart of a method performed by a power testing device, according to one or more embodiments of the present disclosure.
Figure 4B:
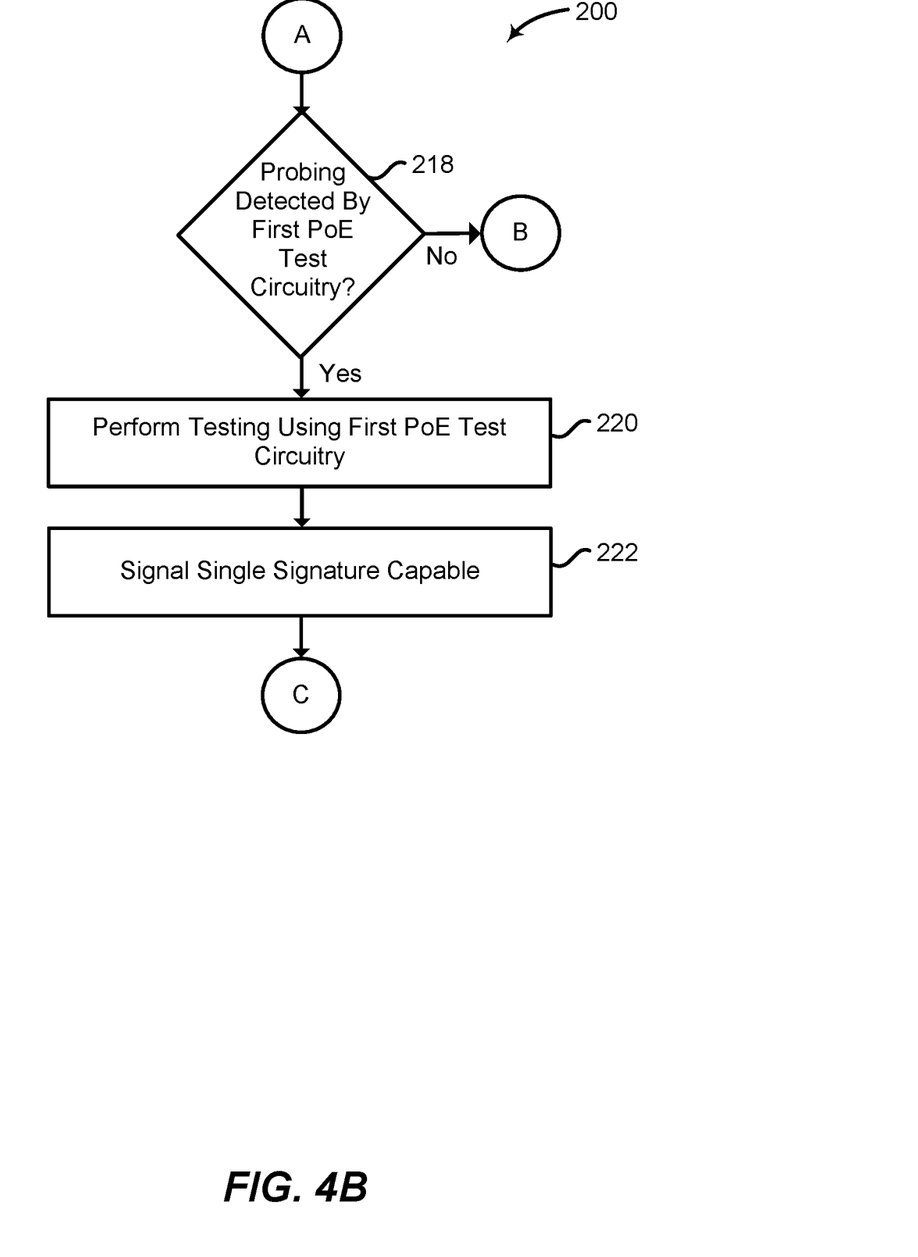
Figure 4C:
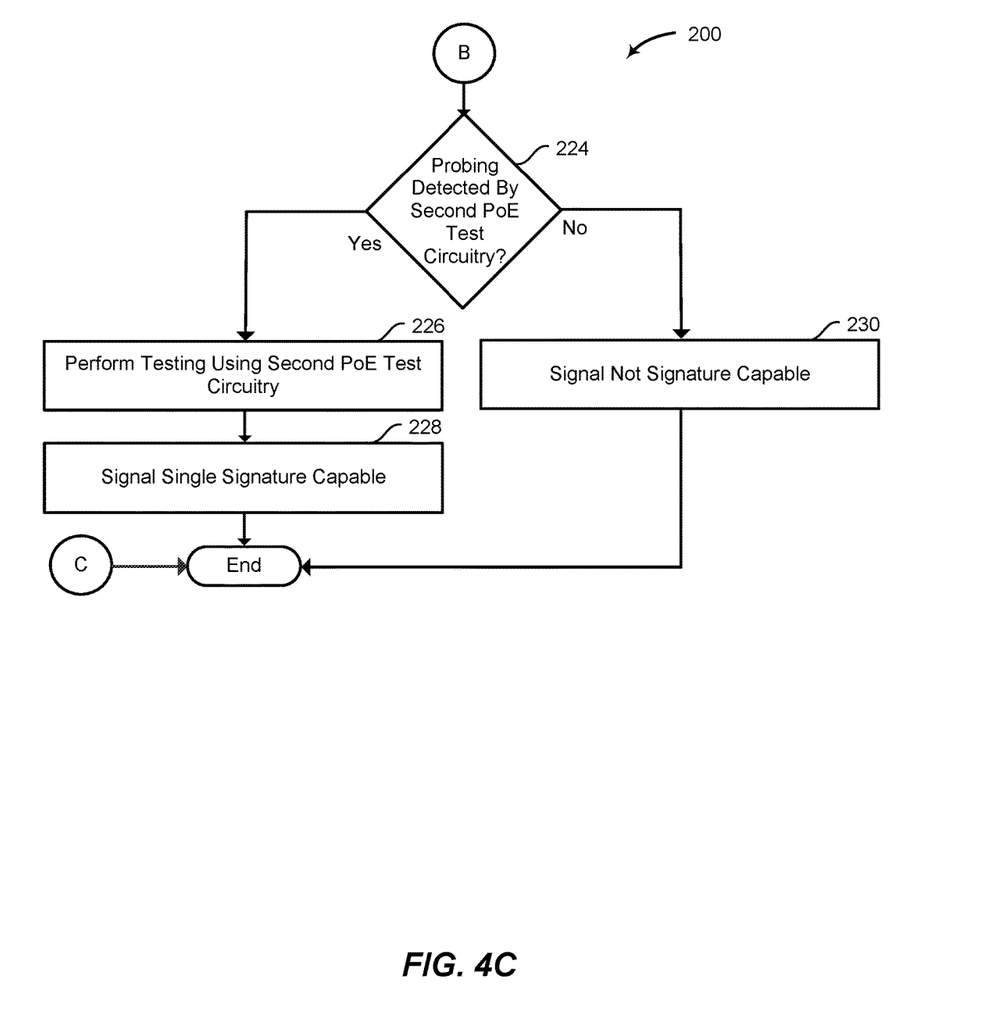

FIGS. 4A, 4B, and 4C are diagrams illustrating a flowchart of a method 200 performed by a power testing device 104, according to one or more embodiments of the present disclosure.

At 202, the power testing device 104 receives an indication that an operator would like to start testing of the power sourcing device 102. For example, after an operator has connected the Ethernet cable 110 to the power sourcing device 102 and the power testing device 104, the operator presses a button of the I/O circuitry 124, which causes a predetermined terminal of the microprocessor 114 to receive a signal indicating that testing is to be started. The method 200 then proceeds to 204.

At 204, the power testing device 104 isolates the first PoE test circuitry 128 and the second PoE test circuitry 132 from each other. More particularly, the microprocessor 114 outputs to the switch 138 a control signal that causes the switch 138 to be in an open or non-conductive state. While the switch 138 is in the open state, the data isolation circuitry 134 and the power isolation circuitry 136 isolate data and power signals, respectively, that are received by the second PoE test circuitry 132 from being influenced by other electrical components of the power testing device 104, including the first PoE test circuitry 128. The method 200 then proceeds to 206.

At 206, the power testing device 104 initializes the first PoE test circuitry 128 and the second PoE test circuitry 132 so that they are ready to begin testing characteristics of any power signal(s) provided by the power sourcing device 102. More particularly, the microprocessor 114 outputs to the first PoE test circuitry 128 a control signal that causes the first PoE test circuitry 128 to have a high impedance (e.g., 200 Kohms) on input terminals that are electrically coupled to pin 1, pin 2, pin 3, and pin 6 of the communication port 108, which may be referred to herein as "the 12-36 pair set" of the communication port 108. Additionally, the microprocessor 114 outputs to the second PoE test circuitry 132 a control signal that causes the second PoE test circuitry 132 to have a high impedance (e.g., 200 Kohms) on input terminals that are electrically coupled to pin 4, pin 5, pin 7, and pin 8 of the communication port 108, which may be referred to herein as "the 45-78 pair set" of the communication port 108. The method 200 then proceeds to 208.

At 208, the power testing device 104 determines whether both the first PoE test circuitry 128 and the second PoE test circuitry 132 detect probing signals that are transmitted by the power sourcing device 102 as part of a PoE negotiation process. More particularly, the microprocessor 114 determines whether it has received a signal from the first PoE test circuitry 128 indicating that the first PoE test circuitry 128 has detected such a probing signal on the 12-36 pair set, and determines whether it has received a signal from the second PoE test circuitry 132 indicating that the second PoE test circuitry 132 has detected such a probing signal on the 45-78 pair set. If the microprocessor 114 receives signals from both the first PoE test circuitry 128 and the second PoE test circuitry 132 indicating that such probing signals have been detected, the power testing device 104 determines that both the first PoE test circuitry 128 and the second PoE test circuitry 132 have detected probing signals and the method 200 proceeds to 210. If not (i.e., if probing signals are detected by only one or neither of the first PoE test circuitry 128 and the second PoE test circuitry 132), the method 200 proceeds to 218.

At 210, the power testing device 104 performs testing using the first PoE test circuitry 128. More particularly, the microprocessor 114 provides to the first PoE test circuitry 128 signals that cause the first PoE test circuitry 128 to perform PoE testing using the 12-36 pair set of the communication port 108, and receives from the first PoE test circuitry 128 data indicating results of testing performed by the first PoE test circuitry 128. In one or more embodiments, at 210, the microprocessor 114 controls the first PoE test circuitry 128 to perform testing using the 12-36 pair set of the communication port 108, as described below in connection with FIG. 5.

In one or more embodiments, at 210, the first PoE test circuitry 128 sends signals to the power sourcing device 102 using the 12-36 pair set, receives signals from the power sourcing device 102 using the 12-36 pair set, and determines from the received signals a minimum necessary power consumption to keep the power sourcing device 102 supplying power.

In one or more embodiments, at 210, the microprocessor 114 controls the first PoE test circuitry 128 to perform a power negotiation process in which the first PoE test circuitry 128 initially uses a first predetermined amount of power for a predetermined period of time, then uses a second predetermined amount of power for the predetermined period of time, then uses a third predetermined amount of power for the predetermined period of time, etc., The first predetermined amount of power is greater than the second predetermined amount of power, and the second predetermined amount of power is greater than the third predetermined amount of power. Accordingly, the power used by the first PoE test circuitry 128 is gradually reduced during the power negotiation process. At some point the power sourcing device 102 will decide that the first PoE test circuitry 128 is using so little power that nothing is connected to it, and will completely turn off the power and go back to probing on the 12-36 pair set. The first PoE test circuitry 128 and/or the microprocessor 114 notes the predetermined power level used by the first PoE test circuitry 128 that results in the power sourcing device 102 completely turning off the power on the 12-36 pair set, and determines that the next greatest predetermined amount of power is the minimum necessary power consumption to keep the power sourcing device 102 supplying power. For example, if the power sourcing device 102 completely turns off the power on the 12-36 pair set while the first PoE test circuitry 128 uses the third predetermined amount of power, the first PoE test circuitry 128 and/or the microprocessor 114 determines that the second predetermined amount of power is the minimum necessary power consumption to keep the power sourcing device 102 supplying power.

In one or more embodiments, at 210, the first PoE test circuitry 128 sends signals to the power sourcing device 102 using the 12-36 pair set, receives signals from the power sourcing device 102 using the 12-36 pair set, and determines from the received signals a maximum inrush power to the power testing device 104 that is supported by the power sourcing device 102. The method 200 then proceeds to 212.

In one or more embodiments, at 210, the first PoE test circuitry 128 performs a power negotiation process with the power sourcing device 102, and after the negotiation process is complete, the power sourcing device 102 provides a high voltage (e.g., 40-60V) via the 12-36 pair set. In response to the power sourcing device 102 providing the high voltage via the 12-36 pair set, the first PoE test circuitry 128 and/or the microprocessor 114 causes a first load to be connected to the 12-36 pair set for a predetermined period of time and measures the inrush power from the power sourcing device 102 flowing through the first load, then causes a second load to be connected to the 12-36 pair set for the predetermined period of time and measures the inrush power from the power sourcing device 102 flowing through the second load, and then causes a third load to be connected to the 12-36 pair set for the predetermined period of time and measures the inrush power from the power sourcing device 102 flowing through the load, etc. The respective impedances of the first, second, and third loads are selected such that the inrush power flowing through the first load is less than the inrush power through the second load, and the inrush power flowing through the second load is less than the inrush power through the third load. Accordingly, the load connected to the 12-36 pair set is gradually changed such that the inrush power to the power testing device 104 gradually increases during the power negotiation process. At some point the power sourcing device 102 will decide that the inrush power to the power testing device 104 is too high, and the power sourcing device 102 will shut off the voltage on the 12-36 pair set and go back to low voltage probing. The first PoE test circuitry 128 and/or the microprocessor 114 notes the predetermined load that results in the power sourcing device 102 completely turning off the power on the 12-36 pair set, and determines that the maximum inrush power to the power testing device 104 that is supported by the power sourcing device 102 is the most recently measured inrush power that did not result in the power sourcing device 102 shutting off the voltage on the 12-36 pair set and going back to low voltage probing. For example, if the power sourcing device 102 completely turns off the power on the 12-36 pair set while the third load is connected to the 12-36 pair set, the first PoE test circuitry 128 and/or the microprocessor 114 determines that the maximum inrush power to the power testing device 104 that is supported by the power sourcing device 102 is the inrush power that was measured while the second load was connected to the 12-36 pair set.

At 212, the power testing device 104 performs testing using the second PoE test circuitry 132. More particularly, the microprocessor 114 provides to the second PoE test circuitry 132 signals that cause the second PoE test circuitry 132 to perform PoE testing using the 45-78 pair set of the communication port 108, and receives from the second PoE test circuitry 132 data indicating results of testing performed by the second PoE test circuitry 132. In one or more embodiments, at 212, the microprocessor 114 controls the second PoE test circuitry 132 to perform testing using the 45-78 pair set of the communication port 108, as described below in connection with FIG. 5. In one or more embodiments, at 212, the second PoE test circuitry 132 sends signals to the power sourcing device 102 using the 45-78 pair set, receives signals from the power sourcing device 102 using the 45-78 pair set, and determines from the received signals a minimum necessary power consumption to keep the power sourcing device 102 supplying power.

In one or more embodiments, at 212, the microprocessor 114 controls the second PoE test circuitry 132 to perform a power negotiation process in which the second PoE test circuitry 132 initially uses a first predetermined amount of power for a predetermined period of time, then uses a second predetermined amount of power for the predetermined period of time, then uses a third predetermined amount of power for the predetermined period of time, etc., The first predetermined amount of power is greater than the second predetermined amount of power, and the second predetermined amount of power is greater than the third predetermined amount of power. Accordingly, the power used by the second PoE test circuitry 132 is gradually reduced during the power negotiation process. At some point the power sourcing device 102 will decide that the second PoE test circuitry 132 is using so little power that nothing is connected to it, and will completely turn off the power and go back to probing on the 45-78 pair set. The second PoE test circuitry 132 and/or the microprocessor 114 notes the predetermined power level used by the second PoE test circuitry 132 that results in the power sourcing device 102 completely turning off the power on the 45-78 pair set, and determines that the next greatest predetermined amount of power is the minimum necessary power consumption to keep the power sourcing device 102 supplying power. For example, if the power sourcing device 102 completely turns off the power on the 45-78 pair set while the second PoE test circuitry 132 uses the third predetermined amount of power, the second PoE test circuitry 132 and/or the microprocessor 114 determines that the second predetermined amount of power is the minimum necessary power consumption to keep the power sourcing device 102 supplying power.

In one or more embodiments, at 212, the second PoE test circuitry 132 sends signals to the power sourcing device 102 using the 45-78 pair set, receives signals from the power sourcing device 102 using the 45-78 pair set, and determines from the received signals a maximum inrush power to the power testing device 104 that is supported by the power sourcing device 102.

In one or more embodiments, at 212, the microprocessor 114 controls the second PoE test circuitry 132 to perform a power negotiation process with the power sourcing device 102, and after the negotiation is complete, the power sourcing device 102 provides a high voltage (e.g., 40-60V) via the 45-78 pair set. In response to the power sourcing device 102 providing the high voltage via the 45-78 pair set, the second PoE test circuitry 132 and/or the microprocessor 114 causes a first load to be connected to the 45-78 pair set for a predetermined period of time and measures the inrush power from the power sourcing device 102 flowing through the first load, then causes a second load to be connected to the 45-78 pair set for the predetermined period of time and measures the inrush power from the power sourcing device 102 flowing through the second load, and then causes a third load to be connected to the 45-78 pair set for the predetermined period of time and measures the inrush power from the power sourcing device 102 flowing through the load, etc. The respective impedances of the first, second, and third loads are selected such that the inrush power flowing through the first load is less than the inrush power through the second load, and the inrush power flowing through the second load is less than the inrush power through the third load. Accordingly, the load connected to the 45-78 pair set is gradually changed such that the inrush power to the power testing device 104 gradually increases during the power negotiation process. At some point the power sourcing device 102 will decide that the inrush power to the power testing device 104 is too high, and the power sourcing device 102 will shut off the voltage on the 45-78 pair set and go back to low voltage probing. The second PoE test circuitry 132 and/or the microprocessor 114 notes the predetermined load that results in the power sourcing device 102 completely turning off the power on the 45-78 pair set, and determines that the maximum inrush power to the power testing device 104 that is supported by the power sourcing device 102 is the most recently measured inrush power that did not result in the power sourcing device 102 shutting off the voltage on the 45-78 pair set and going back to low voltage probing. For example, if the power sourcing device 102 completely turns off the power on the 45-78 pair set while the third load is connected to the 45-78 pair set, the second PoE test circuitry 132 and/or the microprocessor 114 determines that the maximum inrush power to the power testing device 104 that is supported by the power sourcing device 102 is the inrush power that was measured while the second load was connected to the 45-78 pair set.

In one or more embodiments, the testing performed at 210 and the testing performed at 212 are performed concurrently. In one or more embodiments, the microprocessor 114 controls the first PoE test circuitry 128 to perform a PoE negotiation process via the 12-36 pair set at 210, and the microprocessor 114 causes the second PoE test circuitry 132 to perform a PoE negotiation process via the 45-78 pair set at 212, wherein the PoE negotiation process via the 12-36 pair set is independent of the PoE negotiation process via the 45-78 pair set. The method 200 then proceeds to 214.

At 214, the power testing device 104 signals to an operator that the power sourcing device 102 is dual signature capable. More particularly, the microprocessor 114 causes the display device 122 to display a message indicating that the device being tested (i.e., the power sourcing device 102) is dual signature capable. In one or more embodiments, the microprocessor 114 causes the display device 122 to display information indicating characteristics of the power (e.g., maximum inrush power, minimum necessary power consumption) that the power sourcing device 102 is capable of providing using the 12-36 pair set, and information indicating characteristics of the power (e.g., peak magnitude) that the power sourcing device 102 is capable of providing using the 45-78 pair set. The method 200 then proceeds to 216.

At 216, the power testing device 104 de-isolates the first PoE test circuitry 128 and the second PoE test circuitry 132 from each other. More particularly, the microprocessor 114 outputs to the switch 138 a control signal that causes the switch 138 to be in a closed or conductive state. While the switch 138 is in the closed state, the power received by the second PoE test circuitry 132 is no longer isolated from being influenced by other electrical components of the power testing device 104, including the first PoE test circuitry 128. The method 200 then proceeds to 218, as shown in FIG. 4B, to determine whether the power sourcing device 102 is also single signature capable via either the 12-36 pair set or the 45-78 pair set of the power sourcing device 102.

At 218, the power testing device 104 determines whether the first PoE test circuitry 128 detects probing signals that are transmitted by the power sourcing device 102 as part of a PoE negotiation process. More particularly, the microprocessor 114 determines whether it has received a signal from the first PoE test circuitry 128 indicating that the first PoE test circuitry 128 has detected such a probing signal on the 12-36 pair set. If the microprocessor 114 receives a signal from the first PoE test circuitry 128 indicating that such probing signals have been detected, the power testing device 104 determines that the first PoE test circuitry 128 has detected probing signals and the method 200 proceeds to 220 where it is determined whether the power sourcing device 102 is single signature capable via the 12-36 pair set. If not, the method 200 proceeds to 224, as shown in FIG. 4C.

At 220, the power testing device 104 performs testing using the first PoE test circuitry 128. More particularly, the microprocessor 114 provides to the first PoE test circuitry 128 signals that cause the first PoE test circuitry 128 to perform PoE testing using the 12-36 pair set of the communication port 108, and receives from the first PoE test circuitry 128 data indicating results of testing performed by the first PoE test circuitry 128. In one or more embodiments, at 220, the first PoE test circuitry 128 sends signals to the power sourcing device 102 using the 12-36 pair set, receives signals from the power sourcing device 102 using the 12-36 pair set, and determines from the received signals a minimum necessary power consumption to keep the power sourcing device 102 supplying power in a single signature mode of operation. In one or more embodiments, at 220, the first PoE test circuitry 128 also sends signals to the power sourcing device 102 using the 12-36 pair set, receives signals from the power sourcing device 102 using the 12-36 pair set, and determines from the received signals a maximum inrush power to the power testing device 104 that is supported by the power sourcing device 102 in the single signature mode of operation. These determinations of necessary power consumption and maximum inrush power may be performed in a manner as described above at 210. The method 200 then proceeds to 222.

At 222, the power testing device 104 signals to an operator that the power sourcing device 102 is single signature capable. More particularly, the microprocessor 114 causes the display device 122 to display a message indicating that the device being tested (i.e., power sourcing device 102) is single signature capable. In one or more embodiments, the microprocessor 114 causes the display device 122 to display information indicating characteristics (e.g., minimum necessary power consumption and/or maximum inrush magnitude) of the power that the power sourcing device 102 is capable of providing using the 12-36 pair set. The method 200 then ends, as shown in FIG. 4C.

At 224, the power testing device 104 determines whether the second PoE test circuitry 132 detects probing signals that are transmitted by the power sourcing device 102 as part of a PoE negotiation process. More particularly, the microprocessor 114 determines whether it has received a signal from the second PoE test circuitry 132 indicating that the second PoE test circuitry 132 has detected such a probing signal on the 45-78 pair set. If the microprocessor 114 receives a signal from the second PoE test circuitry 132 indicating that such probing signals have been detected, the power testing device 104 determines that second PoE test circuitry 132 has detected probing signals and the method 200 proceeds to 226 where it is determined whether the power sourcing device 102 is single signature capable via the 45-78 pair set. If not, the method 200 proceeds to 230 where the power testing device 104 signals to an operator that the power sourcing device 102 is not either dual or single signature capable. More particularly, the microprocessor 114 causes the display device 122 to display a message indicating that the device being tested (i.e., power sourcing device 102) is neither dual nor single signature capable. The method 200 then ends. If the power testing device 104 determines that second PoE test circuitry 132 has detected probing signals, then at 226, the power testing device 104 performs testing using the second PoE test circuitry 132. More particularly, the microprocessor 114 provides to the second PoE test circuitry 132 signals that cause the second PoE test circuitry 132 to perform PoE testing using the 45-78 pair set of the communication port 108, and receives from the second PoE test circuitry 132 data indicating results of testing performed by the second PoE test circuitry 132. In one or more embodiments, at 226, the second PoE test circuitry 132 sends signals to the power sourcing device 102 using the 45-78 pair set, receives signals from the power sourcing device 102 using the 45-78 pair set, and determines from the received signals a minimum necessary power consumption to keep the power sourcing device 102 supplying power in a single signature mode of operation. In one or more embodiments, at 226, the second PoE test circuitry 132 also sends signals to the power sourcing device 102 using the 45-78 pair set, receives signals from the power sourcing device 102 using the 45-78 pair set, and determines from the received signals a maximum inrush power to the power testing device 104 that is supported by the power sourcing device 102 in the single signature mode of operation. These determinations of necessary power consumption and maximum inrush power may be performed in a manner as described above at 212. The method 200 then proceeds to 228.

At 228, the power testing device 104 signals to an operator that the power sourcing device 102 is single signature capable. More particularly, the microprocessor 114 causes the display device 122 to display a message indicating that the device being tested (i.e., power sourcing device 102) is single signature capable. In one or more embodiments, the microprocessor 114 causes the display device 122 to display information indicating characteristics (e.g., minimum necessary power consumption and/or maximum inrush magnitude) of the power that the power sourcing device 102 is capable of providing using the 45-78 pair set. The method 200 then ends.

Figure 5:
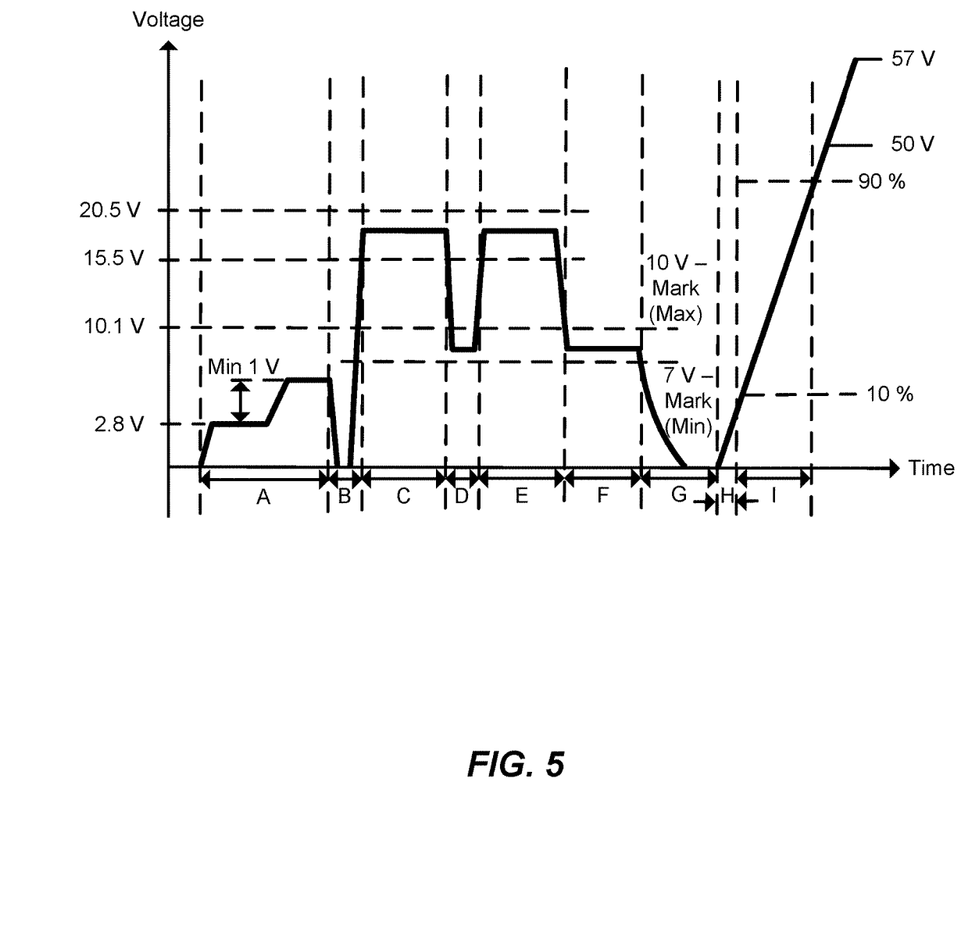
FIG. 5 is a diagram illustrating aspects of a power negotiation process between a power sourcing device and a power testing device, according to one or more embodiments of the present disclosure.

FIG. 5 is a diagram illustrating aspects of a power negotiation process between a power sourcing device 102 and a power testing device 104, according to one or more embodiments of the present disclosure. The voltage levels and relative timing of events during the power negotiation process shown in FIG. 5 are merely examples; other voltage levels and relative timing of events may be used without departing from the scope of the present disclosure. In this example, the power sourcing device 102 emulates a Type-2 PSE, as defined by IEEE802.3at specifications. FIG. 5 shows a graph of voltage level in volts versus time in milliseconds. The voltage level is output by the power sourcing device 102 on one or more pair sets, and is detected by the power testing device 104 during the power negotiation process between the power sourcing device 102 and the power testing device 104. The power testing device 104 deduces capabilities of the power sourcing device 102 based on the particular voltage levels detected at various times during the negotiation process. In response to detecting a particular voltage level output by the power sourcing device 102 during a classification event included in the negotiation process, the power testing device 104 draws a corresponding current level to signal capabilities of the power testing device 104, which the power sourcing device 102 detects.

In the example shown in FIG. 5, the negotiation process between the power sourcing device 102 and the power testing device 104 includes time periods A through I. In one or more embodiments, the power negotiation process shown in FIG. 5 is conducted at least in part using the Link Layer Discovery Protocol (LLDP), which is part of the Ethernet protocol standards.

The time period A is a signature detection time period, which has a maximum duration of 500 milliseconds. During the signature detection time period A, the power sourcing device 102 outputs a voltage level of 2.8 volts, and then increases the output voltage level by a minimum of 1 volt. The power testing device 104 measures the voltage level output by the power sourcing device 102 and notes the timing associated with the increase in the voltage output by the power sourcing device 102. In one or more embodiments, the power testing device 104 detects the signature provided by the power sourcing device 102 using conventional PoE signature detection techniques.

In one or more embodiments, during the signature detection time period A, the power sourcing device 102 outputs probing signals that supply a plurality of low-level voltage levels, for example, each of the low-level voltage levels is in a range from 2.8 volts to 10 volts. In one or more embodiments, the output voltage level temporarily drops to 0 volts between one or more of the low-level voltage levels. The power testing device 104 detects the probing signals during the signature detection time period A. In one or more embodiments, at 208 described above in connection with FIG. 4A, the first PoE test circuitry 128 determines whether such probing signals are detected using the 12-36 pair set of the communication port 108 during a first signature detection time period A of a first power negotiation process between the power sourcing device 102 and the power testing device 104, and the second PoE test circuitry 132 determines whether such probing signals are detected using the 45-78 pair set of the communication port 108 during a second signature detection time period A of a second power negotiation process between the power sourcing device 102 and the power testing device 104.

The time period B follows the time period A. During the time period B, the power sourcing device 102 temporarily reduces its output voltage.

The time period C follows the time period B. The time period C is a first classification event time period, which has a duration of 6 milliseconds to 30 milliseconds. During the first classification event time period C, the power sourcing device 102 outputs a classification voltage level that is between 15.5 and 20.5 volts, which is detected by the power testing device 104. In response, the power testing device 104 draws a classification current having a magnitude that corresponds to the detected classification voltage level, which is detected by the power sourcing device 102.

The time period D follows the time period C. The time period D is a first mark event time period, which has a duration of 6 milliseconds to 12 milliseconds. During the first mark event time period D, the power sourcing device 102 reduces its output voltage. Additionally, the power testing device 104 draws a mark current having a magnitude that indicates a particular class number, which is detected by the power sourcing device 102, and provides a particular cable loop resistance corresponding to the indicated class number. In one or more embodiments, the power testing device 104 draws mark currents that are between 0.25 milliamperes and 4 milliamperes, and does not allow the current to change such that it looks like a valid signature resistor. Additionally, the power testing device 104 draws the mark currents as soon as the classification voltage drops below 14.5V at the power testing device 104. In one or more embodiments, the power testing device 104 may emulate a typical Type 1 PD and provide the right signature resistance and draw the right classification current for both events, but fail to draw the correct mark currents.

Table 1 provided below shows a mapping between various class numbers and corresponding maximum power consumption values in watts, according to one or more embodiments of the present disclosure. In this example, during the first mark event time period D, the power testing device 104 draws a mark current having a magnitude that indicates a class number of 4, and provides a cable loop resistance that is less than 12.5 ohms. In one or more embodiments, a classification current sink from the power testing device 104 turns off at about 14 volts, and the voltage level output by the power sourcing device 102 may "float" higher than the voltage level shown in the first mark event time period D of FIG. 5.

The time period E follows the time period D. The time period E is a second classification event time period, which has a duration of 6 milliseconds to 30 milliseconds. During the second classification event time period E, the power sourcing device 102 outputs a classification voltage level that is between 15.5 and 20.5 volts, which is detected by the power testing device 104. In response, the power testing device 104 draws a classification current having a magnitude that corresponds to the detected classification voltage level.

TABLE 1

| Class Number | Maximum Power |
|---|---|
| 1 | 3.84 W |
| 2 | 6.49 W |
| 3 | 13 W |
| 4 | 25.5 W |
| 5 | 40 W |
| 6 | 51 W |
| 7 | 62 W |
| 8 | 71.3 W |

It is noted that the power sourcing device 102 provides a second classification event in response to the power testing device 104 drawing the mark current having the magnitude that indicates the class number of 4 during the first classification event. In other words, the power sourcing device 102 outputs a voltage during the second classification event time period E in response to the power testing device 104 drawing the mark current having the magnitude that indicates the class number of 4 during the first mark event time period D. If the power testing device 104 had provided a mark current having a magnitude that indicates a class number of less than 4 (i.e., 0, 1, 2, 3) during the first mark event time period D, the power testing device 104 may not output the voltage level that is between 15.5 and 20.5 volts in the second classification event time period E. In other words, the power testing device 104 may not provide the second classification event. Additionally, if the power testing device 104 indicates a class number of 4 using LLDP during the first mark event time period D, the power testing device 104 may not provide the second classification event by outputting the voltage level that is between 15.5 and 20.5 volts in the second classification event time period D.

The time period F follows the time period E. The time period F is a second mark event time period, which has a duration of 6 milliseconds to 12 milliseconds. During the second mark event time period F, the power testing device 104 draws a mark current having a magnitude that indicates a particular class number. In this example, during the second mark event time period F, the power testing device 104 once again draws the mark current having the magnitude that indicates the class number of 4, which is detected by the power sourcing device 102, and provides the cable loop resistance that is less than 12.5 ohms. In one or more embodiments, the classification current sink from the power testing device 104 turns off at about 14 volts, and the voltage level output by the power sourcing device 102 may "float" higher than the voltage level shown in the second mark event time period F in FIG. 5.

The time period G follows the second mark event time period F. The time period G is a time period in which the power sourcing device 102 temporarily lowers its output voltage level. The maximum amount of time between the end of the signature detection time period A and the end of the time period G is 400 milliseconds.

The time period H follows the second mark event time period G. The time period H is a time period in which the power sourcing device 102 begins to increase its output voltage level to a steady-state output voltage level, wherein the steady-state output voltage level corresponds to the class number indicated by the power testing device 104.

The time period I follows the time period H. The time period I is a time period during which the power sourcing device 102 goes from outputting ten percent of its steady-state output voltage level to outputting ninety percent of its steady-state output voltage level. The minimum duration of the time period I is 15 microseconds.

For example, if the power testing device 104 draws the appropriate mark current (i.e., class 4 current draw) during both the first mark event time period D and the second mark event time period F, the power sourcing device 102 outputs 30 watts of power after the time period G, which enables the power testing device 104 to draw up to 25.5 watts of power. In other words, if the power testing device 104 draws the appropriate mark current (i.e., class 4 current draw) during both the first mark event time period D and the second mark event time period F, the power sourcing device 102 outputs sufficient power to operate a device with a class number of 4. In response, the power testing device 104 may display a message indicating that the power sourcing device 102 is a capable of supporting a class 4 device.

Although FIG. 5 shows the power sourcing device 102 using two classification events, the power sourcing device 102 may use a different number of classification events (e.g., 5 classification events). In other words, the power sourcing device 102 may provide additional classification event time periods and corresponding mark event time periods during which the power testing device 104 draws appropriate amounts of current.

While the above description refers to Power over Ethernet implementations, the power testing device 104 may be configured with similar features and functionality to test the power-providing capabilities of other power sourcing devices that may provide power via other data communication cabling (i.e., not Ethernet). For example, the power testing device 104 may be configured with similar features and functionality to test the power-providing capabilities of other power sourcing devices that may provide power via High-Definition Multimedia Interface (HDMI) cabling.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A power testing device that tests power providing capabilities of a device under test, the power testing device comprising:
   a communication port including a plurality of pins, the communication port, in operation, receiving signals from the device under test via a cable that includes a plurality of wires electrically coupled to the pins of the communication port;
   first test circuitry electrically coupled to a first set of pairs of the pins of the communication port;
   second test circuitry electrically coupled to a second set of pairs of the pins of the communication port;
   a switch electrically coupled to at least one of the first test circuitry and the second test circuitry,
   wherein, while the switch is in a first state, the first test circuitry and the second test circuitry are electrically isolated from each other, and
   wherein, while the switch is in a second state, the first test circuitry and the second test circuitry are not electrically isolated from each other;
   a processor coupled to the first test circuitry, the second test circuitry, and the switch; and
   a memory coupled to the processor, the memory storing processor-readable instructions that, when executed by the processor, cause the processor to:
      control operation of the first test circuitry;
      control operation of the second test circuitry; and
      control the switch to be in one of the first state or the second state.

2. The power testing device of claim 1 wherein the processor-readable instructions, when executed by the processor, cause the processor to independently control the first test circuitry and the second test circuitry.

3. The power testing device of claim 2 wherein the processor-readable instructions, when executed by the processor, further cause the processor to:
   determine whether probing from the device under test is detected by both the first test circuitry and the second test circuitry while controlling the switch to be in the first state.

4. The power testing device of claim 3, further comprising:
   a display device,
   wherein the processor-readable instructions, when executed by the processor, further cause the processor to:
   in response to determining that probing from the device under test is detected by both the first test circuitry and the second test circuitry:
      control the first test circuitry to perform testing of the device under test using the first set of pairs of the pins of the communication port; and
      control the second test circuitry to perform testing of the device under test using the second set of pairs of the pins of the communication port; and
   after the first test circuitry performs the testing using the first set of pairs of the pins of the communication port and the second test circuitry performs the testing using the second set of pairs of the pins of the communication port:
      control the display to display a message indicating that the device under test is a dual signature capable device; and
      control the switch to be in the second state.

5. The power testing device of claim 4 wherein the processor controls the first test circuitry to perform the testing using the first set of pairs of the pins of the communication port and controls the second test circuitry to perform the testing using the second set of pairs of the pins while the processor controls the switch to be in the first state.

6. The power testing device of claim 4 wherein the processor-readable instructions, when executed by the processor, further cause the processor to:
   in response to determining that probing is detected by the first test circuitry and is not detected by the second test circuitry:
      control the first test circuitry to perform testing of the device under test using the first set of pairs of the pins of the communication port while controlling the switch to be in the second state; and
      control the display device to display a message indicating that the device under test is a single signature capable device.

7. The power testing device of claim 4 wherein the processor-readable instructions, when executed by the processor, further cause the processor to:
   in response to determining that probing is not detected by the first test circuitry and is detected by the second test circuitry:
      cause control the second test circuitry to perform testing of the device under test using the second set of pairs of the pins of the communication port; and
      control the display device to display a message indicating that the device under test is a single signature capable device; and
   in response to determining that probing is not detected by the first test circuitry and the second test circuitry, control the display device to display a message indicating that the device under test is neither a dual nor single signature capable device.

8. The power testing device of claim 1, further comprising:
   data isolation circuitry electrically coupled to the processor and the second test circuitry, the data isolation circuitry, in operation, providing to the second test circuitry a data signal that is electrically isolated from the first test circuitry; and power isolation circuitry including an input terminal electrically coupled to a terminal which provides a power signal that is not electrically isolated from the first test circuitry, and an output terminal electrically coupled to a power terminal of the second test circuitry, the power isolation circuitry, in operation, providing to the power input terminal of the second test circuitry a power signal that is electrically isolated from the first test circuitry, wherein the switch includes a first terminal electrically coupled to the terminal which provides the power signal that is not electrically isolated from the first test circuitry, and a second terminal electrically coupled to the power input terminal of the second test circuitry, wherein, while the switch is in the first state, the switch does not electrically couple the input terminal of the power isolation circuitry and the output terminal of the power isolation circuitry and does not provide to the power input terminal of the second test circuitry the power signal that is not electrically isolated from the first test circuitry, and wherein, while the switch is in the second state, the switch electrically couples the input terminal of the power isolation circuitry and the output terminal of the power isolation circuitry and provides to the power input terminal of the second test circuitry the power signal that is not electrically isolated from the first test circuitry.

9. The power testing device of claim 4 wherein the processor-readable instructions, when executed by the processor, further cause the processor to:
control the display device to display a message indicating a characteristic of power provided by the device under test via the first set of pairs of the pins of the communication port; or
control the display device to display a message indicating a characteristic of power provided by the device under test via the second set of pairs of the pins of the communication port; or
control the display device to display a message indicating a characteristic of power provided by the device under test via both the first set of pairs of the pins of the communication port and the second set of pairs of the pins of the communication port.

10. A method of operating a power testing device that tests power providing capabilities of a device under test, the method comprising:
electrically isolating first test circuitry from second test circuitry;
determining whether probing by the device under test is detected by both the first test circuitry and the second test circuitry;
in response to determining that the probing is detected by both the first test circuitry and the second test circuitry:
performing testing of the device under test using a first set of pairs of a plurality of pins of a communication port and the first test circuitry;
performing testing of the device under test using a second set of pairs of the pins of the communication port and the second test circuitry; and
displaying a message indicating that the device under test is a dual signature capable device; and
after performing the testing of the device under test using the first set of pairs of the pins of the communication port and the first test circuitry and performing the testing of the device under test using the second set of pairs of the pins of the communication port and the second test circuitry, de-isolating the first test circuitry from the second test circuitry.

11. The method of claim 10 wherein performing the testing of the device under test using the first set of pairs of the pins of the communication port and the first test circuitry and performing the testing of the device under test using the second set of pairs of the pins of the communication port and the second test circuitry are performed concurrently.

12. The method of claim 10 wherein the performing of the testing using the first set of pairs of the pins of the communication port and the first test circuitry, the performing of the testing using the second set of pairs of the pins of the communication port and the second test circuitry are performed concurrently, and the isolating of the first test circuitry from the second test circuitry are performed concurrently.

13. The method of claim 10 wherein de-isolating the first test circuitry from the second test circuitry is performed after determining that the device under test is the dual signature capable device.

14. The method of claim 10, further comprising:
determining that probing is detected by the first test circuitry;
determining that probing is not detected by the second test circuitry;
in response to determining that probing is detected by the first test circuitry and that probing is not detected by the second test circuitry:
performing testing of the device under test using the first set of pairs of the pins of the communication port and the first test circuitry; and
displaying a message indicating that the device under test is a single signature capable device.

15. The method of claim 14, further comprising:
displaying a message indicating that the device under test provides power by pins 1, 2, 3, and 6 of the communication port.

16. The method of claim 14, further comprising:
displaying a message indicating a characteristic of power provided by the device under test via the first set of pairs of the pins of the communication port.

17. The method of claim 10, further comprising:
determining that probing is not detected by the first test circuitry;
determining that probing is detected by the second test circuitry;
in response to determining that probing is not detected by the first test circuitry and that probing is detected by the second test circuitry:
performing testing of the device under test using the second set of pairs of the pins of the communication port and the second test circuitry; and
displaying a message indicating that the device under test is a single signature capable device.

18. The method of claim 17, further comprising:
displaying of a message indicating that the device under test provides power by pins 4, 5, 7, and 8 of the communication port.

19. The method of claim 17, further comprising:
displaying of a message indicating a characteristic of power provided by the device under test via the second set of pairs of the pins of the communication port.

20. The method of claim 10, further comprising:
determining that probing is not detected by the first test circuitry during the de-isolating of the first test circuitry from the second test circuitry;

determining that probing is not detected by the second test circuitry during the de-isolating of the first test circuitry from the second test circuitry; and in response to the determining that probing is not detected by the first test circuitry and that probing is not detected by the second test circuitry, displaying a message indicating that the device under test is neither a dual nor single signature capable device.

* * * * *